(12) United States Patent
Klim et al.

(10) Patent No.: US 6,172,529 B1
(45) Date of Patent: Jan. 9, 2001

(54) COMPOUND DOMINO LOGIC CIRCUIT HAVING OUTPUT NOISE ELIMINATION

(75) Inventors: Peter Juergen Klim; James E. Dunning, both of Austin, TX (US)

(73) Assignees: International Business Machines Corporation, Armonk, NY (US); Motorola, Inc., Schaumburg, IL (US)

( * ) Notice: Under 35 U.S.C. 154(b), the term of this patent shall be extended for 0 days.

(21) Appl. No.: 09/161,893

(22) Filed: Sep. 28, 1998

(51) Int. Cl.[7] .............................................. H03K 19/096
(52) U.S. Cl. ................................ 326/98; 326/28; 326/121
(58) Field of Search ........................... 326/26–27, 22–24, 326/93, 95, 98, 121, 112, 119, 28

(56) References Cited

U.S. PATENT DOCUMENTS

| | | |
|---|---|---|
| 4,464,587 | 8/1984 | Suzuki et al. . |
| 4,668,880 | 5/1987 | Shoji . |
| 4,710,650 | 12/1987 | Shoji . |
| 5,015,882 | 5/1991 | Houston et al. . |
| 5,065,048 * | 11/1991 | Asai et al. ............................ 326/17 |
| 5,208,490 | 5/1993 | Yetter . |
| 5,317,204 | 5/1994 | Yetter et al. . |
| 5,381,063 | 1/1995 | Erhart et al. . |
| 5,389,835 | 2/1995 | Yetter . |
| 5,450,019 * | 9/1995 | McClure et al. ...................... 326/27 |
| 5,488,319 | 1/1996 | Lo . |
| 5,489,866 | 2/1996 | Diba . |
| 5,525,916 * | 6/1996 | Gu et al. ............................. 326/121 |
| 5,541,537 | 7/1996 | Kim et al. . |
| 5,543,735 | 8/1996 | Lo . |
| 5,565,808 | 10/1996 | Lo . |
| 5,602,496 * | 2/1997 | Mahmood ............................. 326/24 |
| 5,777,497 * | 7/1998 | Han ..................................... 326/26 |
| 5,796,285 | 8/1998 | Drouot . |

* cited by examiner

*Primary Examiner*—Jon Santamauro
(74) *Attorney, Agent, or Firm*—Anthony V. S. England; Felsman, Bradley, Vaden, Gunter & Dillon, LLP

(57) ABSTRACT

A domino logic circuit having output noise elimination is disclosed. A compound domino logic circuit includes at least two trees of logic devices arranged in parallel, with each tree having a precharge transistor connected to a power supply, and one or more input transistors coupled between the precharge transistor and ground. The precharge transistor receives a clock input while each of the one or more input transistors receives a signal input. The compound domino logic circuit also includes a logic gate coupled to the precharge transistor to produce a signal output. The logic gate includes at least two transistors connected in series. Further, an adjustment transistor is coupled to a node between the two transistors to ground.

15 Claims, 4 Drawing Sheets

COMPOUND DOMINO LOGIC CIRCUIT HAVING OUTPUT NOISE ELIMINATION

BACKGROUND OF THE INVENTION

1. Technical Field

The present invention relates to semiconductor circuits in general, and in particular to domino logic circuits. Still more particularly, the present invention relates to a compound domino logic circuit having output noise elimination.

2. Description of the Prior Art

A domino logic circuit simplifies digital logic by connecting a number of transistors together in series to implement digital combination logic. For example, a domino logic circuit implements a logic AND function by cascading a p-channel transistor with several n-channel input transistors in series between a power supply and ground. During operation, the p-channel transistor is clocked to precharge an output node of the circuit to a predetermined logic state. Depending on the logic state at the inputs of the n-channel input transistors, the output node either remains at its precharged state or is pulled low through the series of n-channel input transistors connected to ground.

It is quite common for logic gates, such as AND, OR, and their combinations, in certain high performance logic control circuits to have a large number of inputs. However, due to current technology limitations, it is impractical to stack more than four input transistors in a simple domino logic circuit configuration for supporting a large number of inputs; hence typically, a compound domino logic circuit structure having a large fan-in is utilized instead. Due to the size and the stacked configuration of the p-channel transistors at the output of a compound domino logic circuit, a charge sharing problem may occur at the nodes between the p-channel transistors. Consequently, it is desirable to provide a solution to the charge sharing problem in a compound domino logic circuit without adding noise to the output.

SUMMARY OF THE INVENTION

In accordance with a preferred embodiment of the present invention, a compound domino logic circuit includes at least two trees of logic devices arranged in parallel, with each tree having a precharge transistor connected to a power supply, and one or more input transistors coupled between the precharge transistor and ground. The precharge transistor receives a clock input while each of the one or more input transistors receives a signal input. The compound domino logic circuit also includes a logic gate coupled to the precharge transistor to produce a signal output. The logic gate includes at least two transistors connected in series. Further, an adjustment transistor is coupled to a node between the two transistors to ground.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

In high performance processor control and data flow structures, it is quite common for logic gates, such as AND, OR, and their combinations, to have a large number of inputs. However, it is impractical to stack more than four or five transistors in a simple domino logic circuit configuration for providing such a large number of inputs. Thus, a compound domino logic circuit structure having a large fan-in is utilized instead. Although compound domino logic circuits have some advantages over simple domino logic circuits, the speed of compound domino logic circuit outputs is relatively slower, particularly when p-channel transistors are stacked together, such as in an AND gate implementation.

Figure 1:
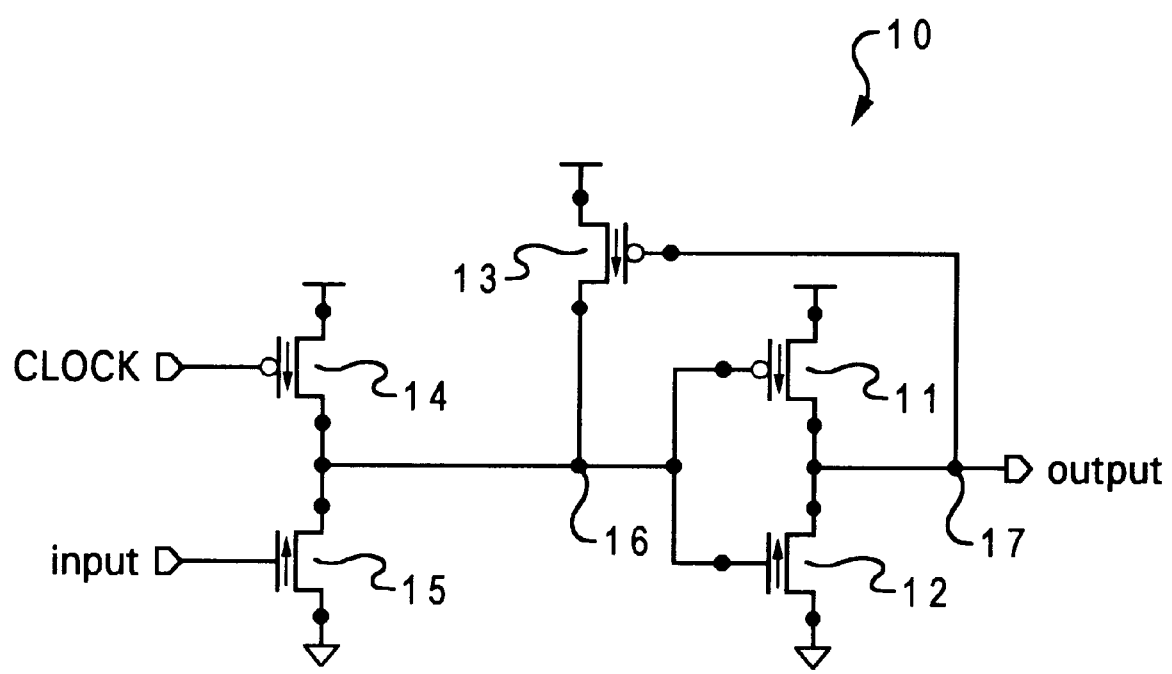
FIG. 1 is a circuit diagram of a conventional simple domino logic circuit having a single output.

Referring now to the drawings and in particular to FIG. 1, there is illustrated a conventional simple domino logic circuit having a single output. Conventional simple domino logic circuit 10 includes a pull-down n-channel transistor 15 and an output inverter formed by a p-channel transistor 11 and an n-channel transistor 12. The output inverter pulls up output node 17 during evaluation and pulls down output node 17 when dynamic node 16 is being precharged high through a p-channel transistor 14 during reset. Half-latch p-channel transistor 13 ensures that dynamic node 16 may not be discharged through leakage currents after transistor 14 has been turned off and prior to data arriving at input node 18. Because it is typically desirable to have the forward evaluation path to be fast and the reset path to 30 be relatively slow, it is therefore a common practice to reduce the size of transistor 12 of the output inverter in order to reduce the loading of transistor 15. This same methodology can also be applied to the design of a compound domino logic circuit.

Figure 2:
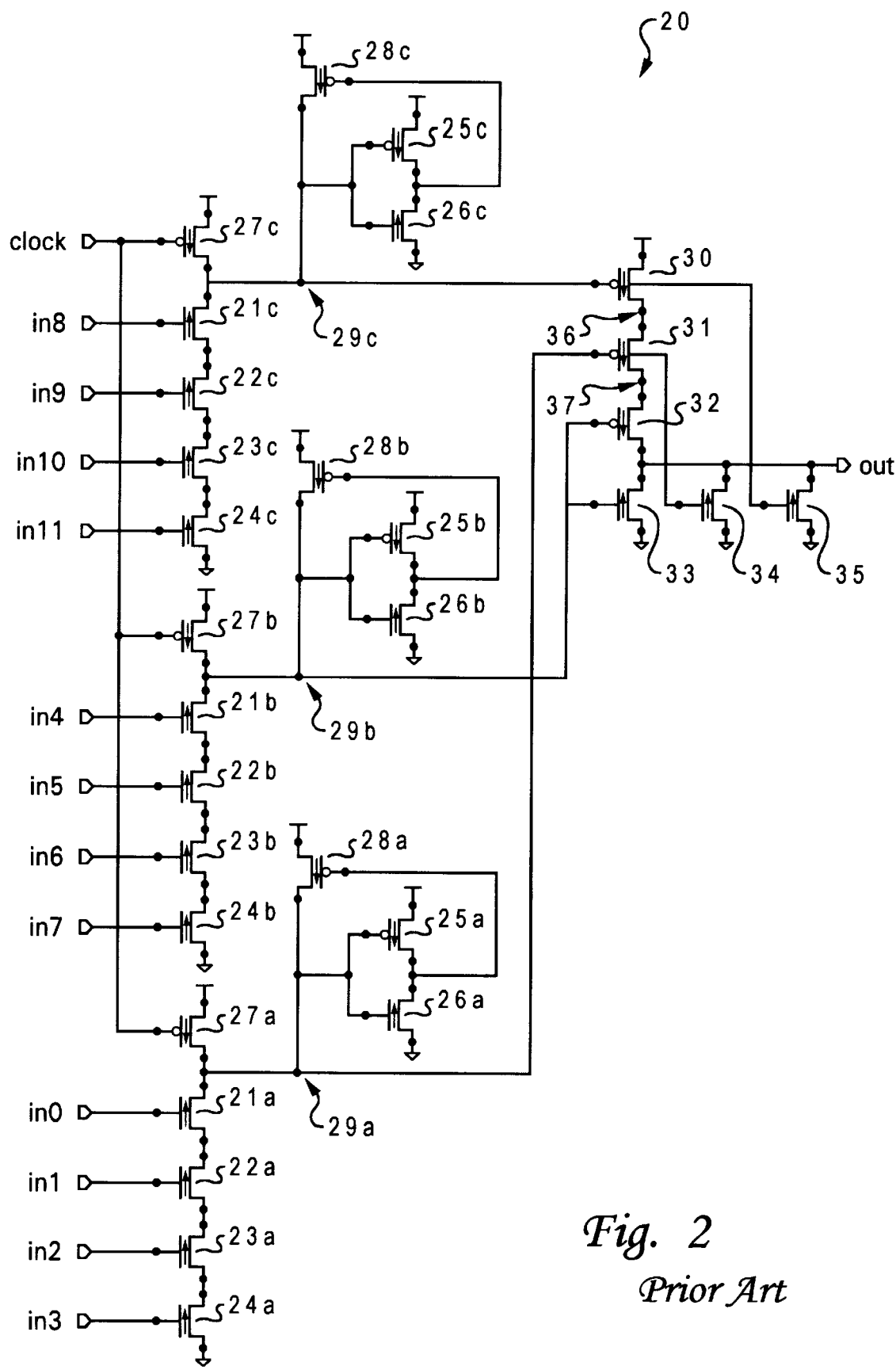
FIG. 2 is a circuit diagram of a compound domino logic circuit of a 12-input AND function, in accordance with the prior art.

With reference now to FIG. 2, there is illustrated a circuit diagram of a compound domino logic circuit of a 12-input AND function, in accordance with the prior art. As shown, compound domino logic circuit 20 s depicts three sets of four-input n-tree structure. The first set of n-tree structure includes n-channel transistors 21a–24a, the second set of n-tree structure includes n-channel transistors 21b–24b, and the third set of n-tree structure includes n-channel transistors 21c–24c.

Each set of n-tree structures is connected to its respective dynamic node. For the first set, the dynamic node is node 29a, the precharge device is a p-channel transistor 27a, and the half-latch is a p-channel transistor 28a. Notice that a feedback inverter, formed by a p-channel transistor 25a and an n-channel transistor 26a, is specifically provided for driving transistor 28a. As for the second set, the dynamic node is node 29b, the precharge device is a p-channel transistor 27b, and the half-latch is a p-channel transistor 28b. A feedback inverter, formed by p-channel transistor 25b and n-channel transistor 26b, is provided to drive transistor 28b. Finally, the dynamic node for the third set is node 29c, the precharge device is a p-channel transistor 27c, and the half-latch is a p-channel transistor 28c. A feedback inverter, formed by p-channel transistor 25c and n-channel transistor 26c, is provided to drive transistor 28c. Dynamic nodes 29a–29c are also coupled to a compound NOR output which includes stacked p-channel transistors 30–32 connected in series and n-channel transistors 33–35 connected in parallel.

For reason stated previously, n-channel transistors 33–35 in the compound NOR output are typically kept small enough in order to increase the performance of compound domino logic circuit 20. If, however, the compound NOR output must drive a similar load as single output domino logic circuit 10 shown in FIG. 1, the strength of stacked p-channel transistors 30–32 must be equivalent to single p-channel transistor 11 in domino logic circuit 10. This implies that each of stacked p-channel transistors 30–32 must be three times as large as p-channel transistor 11 in domino logic circuit 10. For example, if the width of p-channel transistor 11 is 20 $\mu$m, then the width of each of stacked p-channel transistors 30–32 is 60 $\mu$m. These relatively large p-channel transistors 30–32 in a stacked configuration may cause a charge sharing problem at the nodes between the transistors. As a result of the charge sharing problem, some level of noise will be introduced at the output of the compound domino logic circuit, which is not deemed desirable to a subsequent circuit coupled to the output of the compound domino logic circuit.

Figure 4:
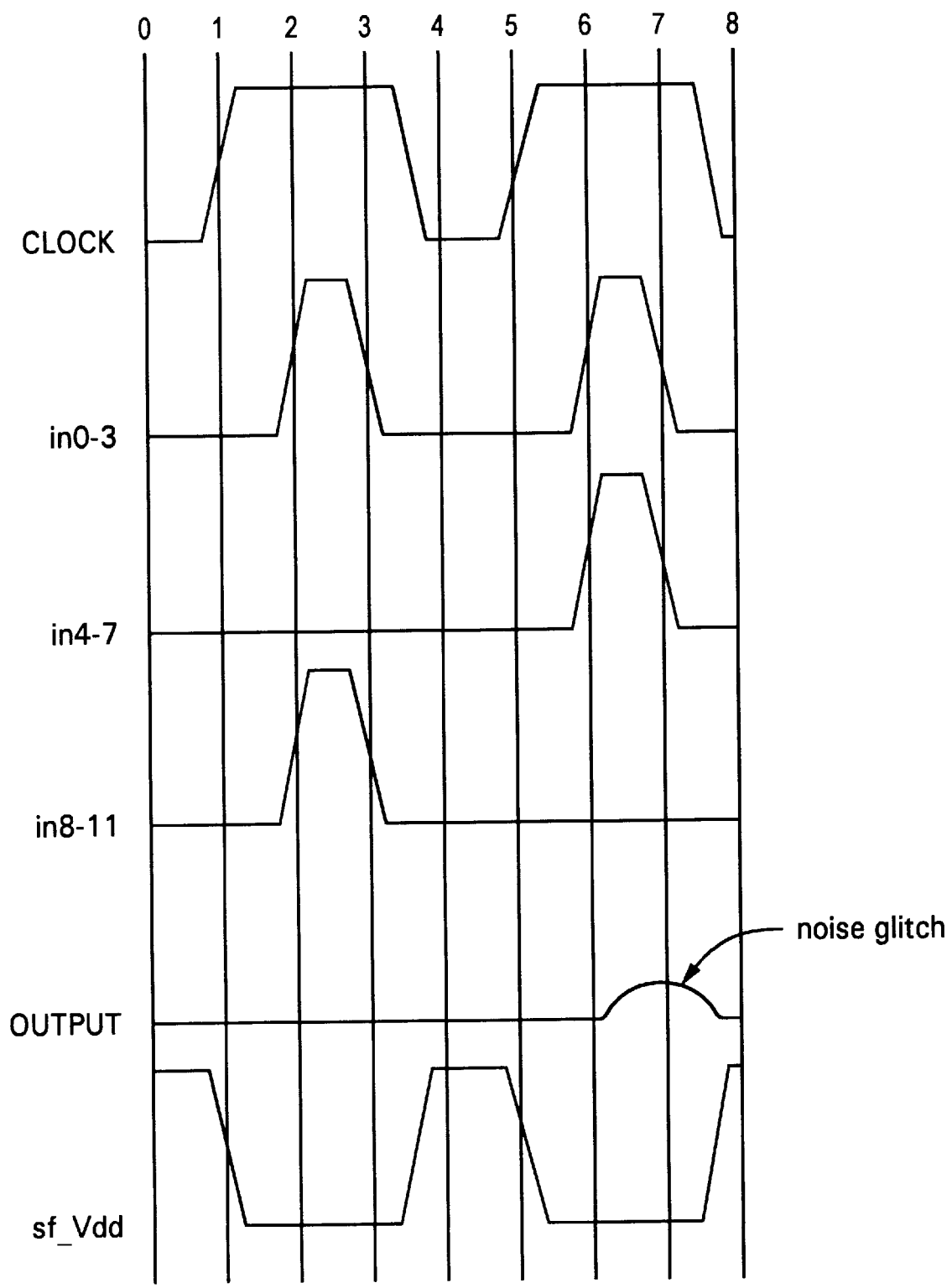
FIG. 4 is a graphical depiction of several exemplary waveforms.

For the purpose of illustration, several input stimulus such as those shown in FIG. 4 may be applied to circuit 20. Signals in0–3, in4–7 and in8–11 in FIG. 4 represent all four inputs to the first set, second set, and third set of n-tree structures in FIG. 2, respectively. Initially, clock signal is low (i.e., a logical "0") and dynamic nodes 29a, 29b, and 29c are precharged to high (i.e., a logical "1") via p-channel transistors 28a, 28b, and 28c, respectively. This will switch on n-channel transistors 33, 34, and 35; hence the output of circuit 20 becomes low. Then clock signal becomes high, and inputs to the first set and the third set of n-tree also become high, pulling dynamic node 29a and dynamic node 29c low, which switches on transistor 31 and transistor 30. Transistor 32 remains off as long as dynamic node 29b is still high, and thus the output remains low. This operation fully charges the diffusion capacitance at node 36 and node 37.

After the evaluation cycle has completed (the output remains low), all input signals switch low again before another precharge operation is performed, indicating the beginning of a next clock cycle. Following the precharge operation, only the inputs of the first set and the second set of the n-tree become high, pulling dynamic node 29a and dynamic node 29b low, respectively. This switches on transistors 31 and 32 and switches off transistors 33 and 34, while transistor 30 (off) and transistor 35 (on) remain in their respective states. At this point, it is expected the output signal to stay low, but in fact a noise glitch occurs at the output. This noise glitch is caused by the fully charged nodes 36 and 37. Because of their relatively large diffusion capacitances, nodes 36 and 37 release their charges onto the output of dynamic domino logic circuit 20 at this point, which show up at the output as noise glitches. Along with the power supply and coupling noise, this kind of noise glitches may be detrimental to the already reduced noise margin of dynamic domino logic circuit 20. As a result of the noise glitches, a circuit coupled to the output of dynamic logic circuit 20 will most likely switch at a non-desirable time.

Figure 3:
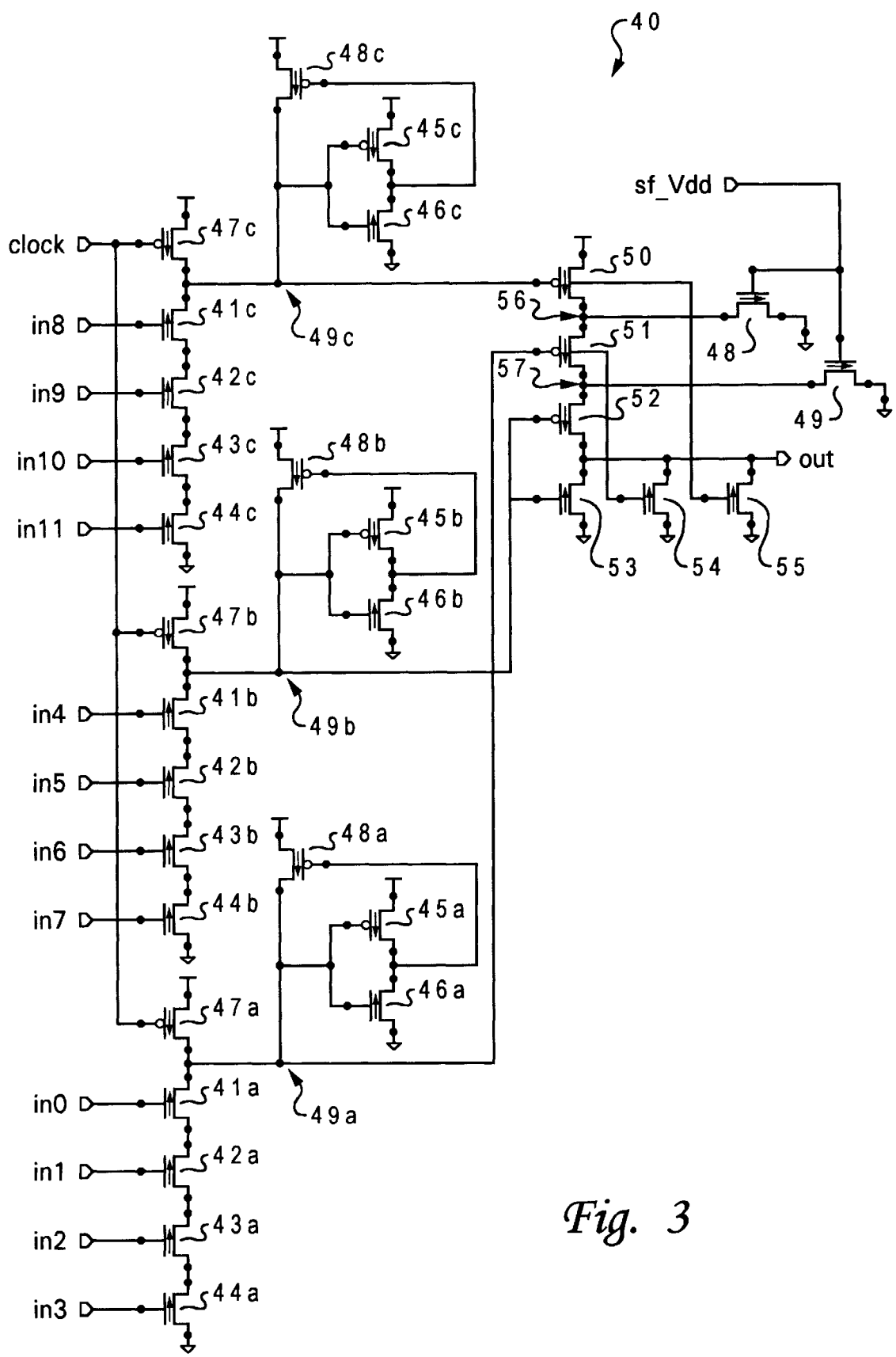
FIG. 3 is a circuit diagram of a compound domino logic circuit of a 12-input AND function, in accordance with a preferred embodiment of the present invention.

Referring now to FIG. 3, there is illustrated a circuit diagram of a compound domino logic circuit of an AND structure, in accordance with a preferred embodiment of the present invention. Similar to compound domino logic circuit 30 20 in FIG. 2, compound domino logic circuit 40 also depicts three sets of four-input n-tree structure. The first set of n-tree structure includes n-channel transistors 41a–44a, the second set of n-tree structure includes n-channel transistors 41b–44b, and the third set of n-tree structure includes n-channel transistors 41c–44c.

Each set of n-tree structure is connected to a respective dynamic node. For the first set, the dynamic node is node 49a, the precharge device is a p-channel transistor 47a, and the half-latch is a p-channel transistor 48a. A feedback inverter, formed by p-channel transistor 45a and n-channel transistor 46a, is provided for driving transistor 48a. As for the second set, the dynamic node is node 49b, the precharge device is a p-channel transistor 47b, and the half-latch is a p-channel transistor 48b. A feedback inverter, formed by p-channel transistor 45b and n-channel transistor 46b, is provided to drive transistor 48b. Finally, the dynamic node for the third set is node 49c, the precharge device is a p-channel transistor 47c, and the half-latch is a p-channel transistor 48c. A feedback inverter, formed by p-channel transistor 45c and n-channel transistor 46c, is provided to drive transistor 48c. Each of dynamic nodes 49a–49c is connected to a compound NOR output that includes stacked p-channel transistors 50–52 and n-channel transistors 53–55.

As a preferred embodiment of the present invention, n-channel transistors 48 and 49 are added to circuit 40. Transistors 48, 49 have small channel widths or even minimum size, if possible. In addition, an input signal sf_$V_{dd}$ is connected to the gate of both transistors 48, 49. The sf_$V_{dd}$ signal can be implemented with a constant $V_{dd}$ power signal or an inverted clock signal. When implemented with an inverted clock signal, the sf_$V_{dd}$ signal switches transistors 48, 49 on during reset (i.e., when the clock signal is low), which should completely discharge nodes 46 and 47 between each evaluation cycle (i.e., when the clock signal is high). As a result, the charges placed at nodes 46, 47 during the above-mentioned evaluation pattern will be removed. Incidentally, the noise glitches as shown in FIG. 4 will be eliminated.

As an alternative embodiment, transistors 48 and 49 may be replaced with p-channel transistors. There may be a small speed improvement with p-channel transistors over n-channel transistors, at the expense of some low level of output noises.

As has been described, the present invention provides an improved compound domino logic circuit having output noise elimination. It should be further understood that this invention applies to all compound domino circuits that are driving their outputs through two or more stacked p-channel transistors.

While the invention has been particularly shown and described with reference to a preferred embodiment, it will be understood by those skilled in the art that various changes in form and detail may be made therein without departing from the spirit and scope of the invention.

What is claimed is:

1. A compound domino logic circuit, comprising:
   a first section and a second section of logic devices arranged in a parallel configuration, wherein each of said two sections includes:
   a precharge transistor connected to a first reference voltage, wherein said precharge transistor receives a clock input signal;
   one or more input transistors coupled between said precharge transistor and a second reference voltage, wherein each of said one or more input transistors receives a signal input; and
   an output node connected to said precharge transistor and at least one of said input transistors;
   an output logic gate connected to each of said output nodes of said first and second sections of logic devices to yield a signal output, wherein said output logic gate includes a plurality of transistors connected in series; and an adjustment transistor connected to a node between said plurality of transistors directly to said second reference voltage such that charges placed at said node between said plurality of transistors are removed when said adjustment transistor is turned on, wherein a gate of said adjustment transistor is connected to a signal for turning on said adjustment transistor, wherein said signal for turning on said adjustment transistor is an inverse of said clock input signal.

2. The domino logic circuit according to claim 1, wherein said first reference voltage is a $V_{dd}$ power signal and said second reference voltage is ground.

3. The domino logic circuit according to claim 2, wherein said precharge transistor is a p-channel transistor.

4. The domino logic circuit according to claim 2, wherein said input transistors are n-channel transistors.

5. The domino logic circuit according to claim 2, wherein said plurality of transistors are p-channel transistors.

6. The domino logic circuit according to claim 1, wherein said adjustment transistor is a p-channel transistor.

7. The domino logic circuit according to claim 1, wherein said signal for turning on said adjustment transistor is a $V_{dd}$ power signal.

8. The do mino logic circuit according to claim 1, wherein said adjustment transistor is an n-channel transistor.

9. A method for eliminating a charge sharing problem in a compound domino logic circuit, said method comprising the step of:

providing a first section and a second section of logic devices arranged in a parallel configuration, wherein each of said two sections includes:

a precharge transistor connected to a power supply, wherein said precharge transistor receives a clock input signal;

one or more input transistors coupled between said precharge transistor and ground, wherein each of said one or more input transistors receives a signal input, and an output node connected to said precharge transistor and at least one of said input transistors;

connecting an output logic gate to each of said output nodes of said first and second sections of logic devices to yield a signal output, wherein said output logic gate includes a plurality of transistors connected in series; and connecting a drain of an adjustment transistor to a node between said plurality of transistors directly to ground, and connecting a gate of said adjustment transistor to a signal for turning on said adjustment transistor such that charges placed at said node between said plurality of transistors are removed when said adjustment transistor is turned on, wherein said signal for turning on said adjustment transistor is an inverse of said clock input signal.

10. The method according to claim 9, wherein said precharge transistor is a p-channel transistor.

11. The method according to claim 9, wherein said input transistors are n-channel transistors.

12. The method according to claim 9, wherein said plurality of transistors are p-channel transistors.

13. The method according to claim 9, wherein said adjustment transistor is a p-channel transistor.

14. The method according to claim 9, wherein said signal for turning on said adjustment transistor is a $V_{dd}$ power signal.

15. The method according to claim 9, wherein said adjustment transistor is an n-channel transistor.

* * * * *